United States Patent

Miyamoto et al.

[11] Patent Number: 5,557,074
[45] Date of Patent: Sep. 17, 1996

[54] COAXIAL LINE ASSEMBLY OF A PACKAGE FOR A HIGH FREQUENCY ELEMENT

[75] Inventors: Takaharu Miyamoto; Fumio Miyagawa, both of Nagano; Yoji Ohashi; Tamio Saito, both of Kawasaki, all of Japan

[73] Assignees: Fujitsu Limited, Kawasaki; Shinko Electric Industries Co., Ltd., Nagano, both of Japan

[21] Appl. No.: 352,157

[22] Filed: Dec. 8, 1994

Related U.S. Application Data

[63] Continuation of Ser. No. 981,417, Nov. 25, 1992, abandoned.

[30] Foreign Application Priority Data

Nov. 27, 1991 [JP] Japan .................................. 3-339856
Feb. 5, 1992 [JP] Japan .................................. 4-019599

[51] Int. Cl.⁶ ................................................. H01B 17/26
[52] U.S. Cl. ................................................. 174/152 GM
[58] Field of Search .................................. 174/151, 152 R, 174/152 GM, 52.1, 52.2, 52.3, 52.6; 439/571, 572, 578

[56] References Cited

U.S. PATENT DOCUMENTS

| | | | |
|---|---|---|---|
| 3,842,374 | 10/1974 | Schlicke | 333/79 |
| 3,854,827 | 12/1974 | Merz et al. | 403/29 |
| 4,117,589 | 10/1978 | Francis et al. | 29/619 |
| 4,421,947 | 12/1983 | Kyle | 174/152 GM |
| 4,587,144 | 5/1986 | Kellerman et al. | 428/36 |
| 4,661,424 | 4/1987 | Matsui et al. | 429/104 |
| 4,737,601 | 4/1988 | Gartzke | 174/152 GM |
| 4,841,101 | 6/1989 | Pollock | 174/152 GM |
| 4,921,452 | 5/1990 | Dozier | 174/152 GM X |
| 4,951,011 | 8/1990 | Heckaman et al. | 174/52.5 X |
| 5,123,863 | 6/1992 | Frederick et al. | 439/578 |
| 5,170,142 | 12/1992 | Bier | 333/245 |
| 5,276,414 | 1/1994 | Fujimoto et al. | 333/246 |

FOREIGN PATENT DOCUMENTS

| | | |
|---|---|---|
| 0338213 | 10/1989 | European Pat. Off. . |
| 2373878 | 7/1978 | France . |

OTHER PUBLICATIONS

*Patent Abstracts of Japan*, vol. 15, No. 417 (E-1125) Oct. 23, 1991 & JP-A-3 172009 (NEC Kansai Ltd) Jul. 25, 1991.

Primary Examiner—Kristine L. Kincaid
Assistant Examiner—Christopher Horgan
Attorney, Agent, or Firm—Staas & Halsey

[57] ABSTRACT

A coaxial line assembly in a package which houses a high frequency element. The assembly includes a metal wall having a hole extending through the metal wall. The metal wall has a step at substantially an intermediate portion of the hole to define a smaller diameter, inner hole portion opened to the inside of the package and a larger diameter, outer hole portion opened to the outside of the package. A lead for transmitting a high frequency signal passes through the hole and is hermetically sealed in the outer hole portion by glass filled in the outer hole portion. A sealing plate closes an opening of the inner hole portion at the step, the lead extending through the sealing plate. The sealing plate is made of a dielectric material having a dielectric constant near to that of the glass and a melting point higher than that of the glass.

4 Claims, 5 Drawing Sheets

5,557,074

1

COAXIAL LINE ASSEMBLY OF A PACKAGE FOR A HIGH FREQUENCY ELEMENT

This application is a continuation of application Ser. No. 07/981,417, filed Nov. 25, 1992, now abandoned.

BACKGROUND OF THE INVENTION

1. Field of the Invention

This invention relates to a coaxial line assembly for transmitting a high frequency signal and, more particularly, relates to such a coaxial line assembly which is provided on a metal wall of a package for mounting thereon a high-frequency element.

2. Description of the Related Art

In the prior art, it is generally known that a metal wall of a package for mounting thereon a high-frequency element is provided with a through hole into which a lead for transmitting a high frequency signal is inserted and hermetically sealed therein by means of a glass to control the characteristic impedance of the lead.

However, in a coaxial line assembly known in the prior art, since the lead inserted in the through hole is embraced with a glass having a high dielectric constant, it is difficult to efficiently transmit a high frequency signal due to a transmission loss of the dielectric material of the glass.

SUMMARY OF THE INVENTION

An object of the present invention is to provide an improved coaxial line assembly in a package for transmitting a high frequency element.

According to an aspect of the present invention, there is provided a coaxial line assembly in a package for a high frequency element, said assembly comprising: a metal wall having an inner surface at an inside of said package and an opposite outer surface at an outside of said package, said metal wall having a through hole opened at one end to said inner surface and at the other end to said outer surface; said metal wall comprising a step at substantially an intermediate portion of said through hole for defining a smaller diameter, inner hole portion opened to said inner surface and a larger diameter, outer hole portion opened to said outer surface; and a lead for transmitting a high frequency signal passing said through hole and hermetically sealed in said larger diameter, outer hole portion by means of a glass filled in said outer hole portion.

In this invention, a bonding ribbon or wire for connecting the lead to a connection pad on a substrate mounted on the metal wall can be shortened and the lead can be held stably, so that the characteristic impedance can be maintained constant.

According to another aspect of the present invention, there is provided a coaxial line assembly in a package for a high frequency element, said assembly comprising: a metal wall having an inner surface at an inside of said package and an opposite outer surface at an outside of said package, said metal wall having a through hole opened at one end to said inner surface and at the other end to said outer surface; said metal wall comprising a step at substantially an intermediate portion of said through hole for defining a smaller diameter, inner hole portion opened to said inner surface and a larger diameter, outer hole portion opened to said outer surface; a lead for transmitting a high frequency signal passing said through hole and hermetically sealed in said larger diameter, outer hole portion by means of a glass filled in said outer hole portion; and a sealing plate for closing an opening of said inner hole portion opened to said outer hole portion at said step, so that said lead passes through said sealing plate, and said sealing plate is made of a dielectric material having a dielectric constant near to that of said glass and a melting point higher than that of said glass.

According to one embodiment of the present invention, a second sealing plate is provided for closing an opening of said outer hole portion opened to outside of the package to cover said glass filled in said outer hole portion, and said second sealing plate is made of a dielectric material having a dielectric constant near to that of said glass and a melting point higher than that of said glass.

In this aspect, the glass filled in the outer hole portion is prevented from creeping up along the lead toward the inner hole portion, so that the characteristic impedance can be maintained constant.

According to a still another aspect of the present invention, a coaxial line assembly in a package for a high frequency element is provided, said assembly comprising: a metal wall having an inner surface at an inside of said package and an opposite outer surface at an outside of said package, said metal wall having a through hole opened at one end to said inner surface and at the other end to said outer surface; said metal wall comprising a step at substantially an intermediate portion of said through hole for defining a smaller diameter, inner hole portion opened to said inner surface and a larger diameter, outer hole portion opened to said outer surface; a lead for transmitting a high frequency signal passing said through hole and hermetically sealed in said larger diameter, outer hole portion by means of a glass filled in said outer hole portion; and a prescribed material provided or filled in at least a part of said smaller diameter, inner hole portion, and said prescribed material having a dielectric constant near to that of air.

In this aspect, the lead is stably held in a position by means of the prescribed material, so that the characteristic impedance can be maintained constant.

DESCRIPTION OF THE PREFERRED EMBODIMENTS

Figure 1:
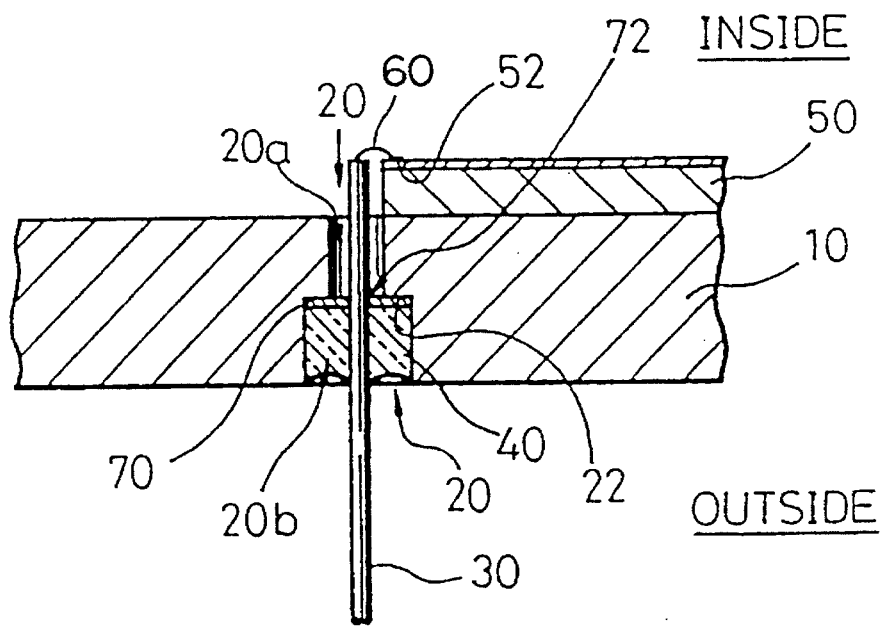
FIG. 1 is an enlarged cross-sectional view of a first embodiment of a coaxial line assembly according to the present invention.

Referring now to the drawings, wherein FIG. 1 is an enlarged cross-sectional view of a first preferred embodiment of a coaxial line assembly according to the present invention.

A package for a high frequency element has a metal wall 10 which is made of cobal (iron-nickel-cobalt alloy) or the like and provided with a through hole 20 having a circular cross-section. For example, the thickness of the metal wall 10 is 2.5–3.0 mm. An inert gas is usually contained in the package.

The through hole 20 is provided with a step 22 at an intermediate portion thereof in such a manner that a first hole portion 20a which has a relatively smaller diameter and is located at the inside of the metal wall 10 and a second hole portion 20b which has a relatively larger diameter and is located at the outside of the metal wall 10. For example, the depth of outer hole portion 20b is 1.0 mm.

In particular, the diameter of the inner hole portion 20a is about ½ or less of the diameter of the outer hole portion 20b. For example, the diameter of the inner hole portion 20a is 0.57 mm and the diameter of the outer hole portion 20b is 1.61 mm. The characteristic impedance of a first portion of the lead 30 passing through the gas environment in the inner hole portion 20a corresponds to the characteristic impedance, such as 50Ω, of a second portion of the lead 30 passing through the outer hole portion 20b filled with a glass 40, so that a high frequency signal can effectively transmitted by means of the lead 30 from the inside to the outside of the metal wall 10 or vice-versa.

The lead 30 made of cobal or the like and having a small circular cross-section (for example, the diameter of the lead 30 being 0.25 mm) is inserted into the through hole 20 of the metal wall 10 for transmitting a high frequency signal from the inside to the outside of the metal wall 10 or vice-versa.

The lead 30 is hermetically sealed with the glass 40 filled in the outer hole portion 20b. Glass 40 is typically a borosilicate glass or similar type of glass.

In the embodiment shown in FIG. 1, the step portion 22 is provide with a sealing plate 70 which closes the opening of the inner hole portion 20a.

The sealing plate 70 has a dielectric constant near to that of the glass 40 and formed of a dielectric material which has a melting point higher than that of the glass 40. The dielectric material of sealing plate 70 is typically a glass containing glass ceramic or alumina.

The relative dielectric constant of borosilicate glass is 5, the relative dielectric constant of glass ceramic is 4.5 to 5.6 and the relative dielectric constant of glass containing alumina is 6.7. On the other hand, the melting point of borosilicate glass is about 700° to 800° C., and the melting points of glass ceramic and glass containing alumina is about 1000° C. or more.

The sealing plate 70 is a disk-shaped and the outer diameter thereof is little smaller than the inner diameter of the outer hole portion 20b.

The sealing plate 70 is provided at the central portion of hole 20 with an opening 72 for passing the lead 30 therethrough.

When fabricating the coaxial line assembly of this embodiment, the lead 30 is first inserted into the central hole of the sealing plate 70. Then, the sealing plate 70 is inserted into the outer hole portion 20b having a larger diameter until the sealing plate 70 comes into contact with the intermediate stepped surface 22. Thus, the intermediate stepped surface 22 and the opening of the inner hole portion 20a having a smaller diameter are covered by the sealing plate 70.

A pellet-like or ring-shaped glass 40 is fitted beforehand onto the lead 30, so that the glass 40 is located in the outer hole portion 20b when the sealing plate 70 comes into contact with the stepped surface 22. Then, the assembly is heated in such a manner that the glass 40 is melted to hermetically seal the lead 30 in the outer hole portion 20b.

FIG. 1 also illustrates a substrate 50 made of, for example, a dielectric material. A conductive line, pattern or pad 52 is formed on the substrate 50. A bonding wire or ribbon 60 connects the conductive line, pattern or pad 52 to the lead 30.

In practice, when fabricating this assembly, the metal wall 10 should be placed reversely up and down as shown in FIG. 1. According to the coaxial line assembly as described above, when the lead 30 is sealed by means of the glass 40 filled in the outer hole portion 20b, the sealing plate 70 prevents the glass 40 from flowing out of the outer hole portion 20b to the inner hole portion 20a via the opening of the inner hole portion 20a.

Figure 2:
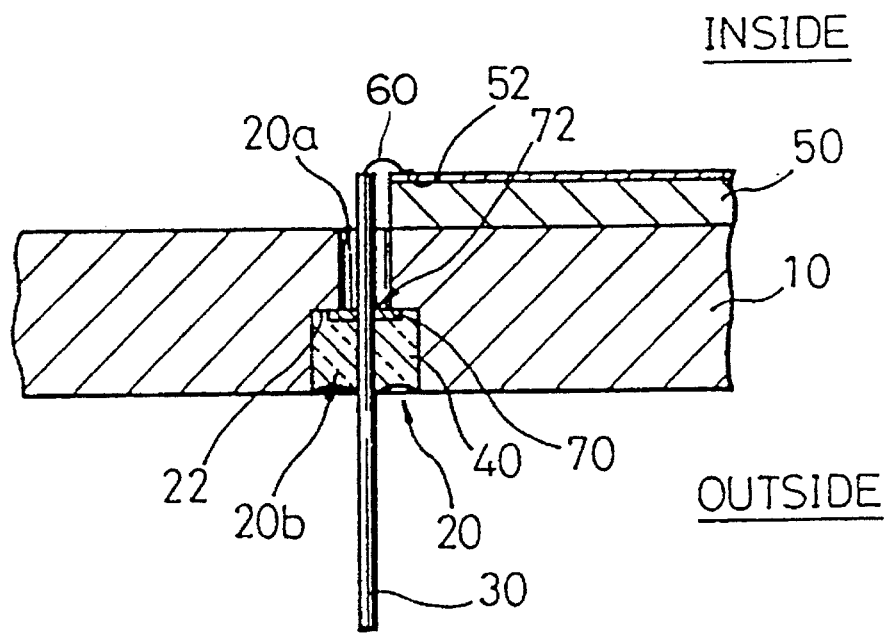
FIG. 2 is an enlarged cross-sectional view of a second embodiment of this invention.

FIG. 2 shows another preferred embodiment of a coaxial line assembly according to the present invention.

In the embodiment shown in FIG. 2, an outer diameter of the sealing plate 70 is reduced in comparison to the first embodiment so that it is near to the diameter of the opening of the inner hole portion 20a.

The cavity of the outer hole portion 20b defined by the side wall and the outer circumferential periphery of the sealing plate 70 and the inner wall of the outer hole portion 20b is filled with the glass 40, without any gaps.

The remaining construction shown in FIG. 2 is the same as that of the coaxial line assembly of the first embodiment shown in FIG. 1. Also, the operation thereof is the same as the first embodiment except for the following. Therefore, the same or corresponding parts in FIG. 2 are indicated by the same reference numerals as those in FIG. 1.

According to the embodiment shown in FIG. 2, even if the sealing plate 70 has a dielectric constant which is different from that of the glass 40, the characteristic impedance of a portion of the lead 30, to which the sealing plate 70 is fit, is prevented from becoming greatly out of order, since a part of the sealing plate 70 as shown in FIG. 1 was replaced by the glass 40.

Figure 3:
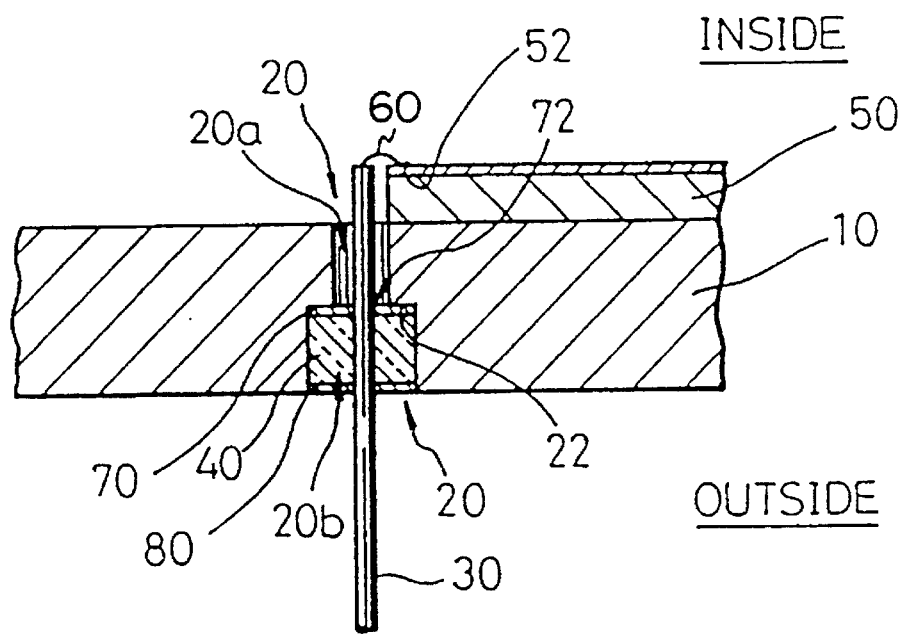
FIG. 3 is an enlarged cross-sectional view of a third embodiment of this invention.

FIG. 3 shows still another preferred embodiment of a coaxial line assembly according to the present invention.

In the embodiment shown in FIG. 3, an opening of the outer hole portion 20b opened to the outside of the metal wall 10 is also closed by a sealing plate 80, so that the glass 40 filled in the outer hole portion 20b is covered by the sealing plate 80. The lead 30 passes through a central hole of the sealing plate 80 as well as the central hole of the sealing plate 70.

The remaining construction shown in FIG. 3 is the same as that of the coaxial line assembly of the first embodiment shown in FIG. 1. Also, the operation thereof is the same as the first embodiment except for the following. Therefore, the same or corresponding parts in FIG. 3 are indicated by the same reference numerals as those in FIG. 1.

According to the embodiment shown in FIG. 3, when the lead 30 is sealed by means of the glass 40 filled in the outer hole portion 20b, the sealing plate 80 prevents the glass 40 from flowing out of the outer hole portion 20b along the lead 30 toward the outside of the metal wall 10 due to a meniscus. Thus, the characteristic impedance of a portion of the lead 30 sealed with the glass 40 is prevented from becoming greatly out of order.

In addition, since the sealing plate 80 is made of a dielectric material which has a melting point higher than that of the glass 40, when the lead 30 is sealed with the glass 40 filled in the outer hole portion 20b, the sealing plate 80 is prevented from melting and disappearing along the lead 30, so that a reduction of the effect of the sealing plate 80 can thus be prevented.

Also, since the sealing plate 80 is made of a dielectric material which has a dielectric constant which is near to that of the glass, the characteristic impedance of a portion of the lead 30, to which the sealing plate 80 is fitted, is prevented from becoming greatly out of order.

Figure 4:
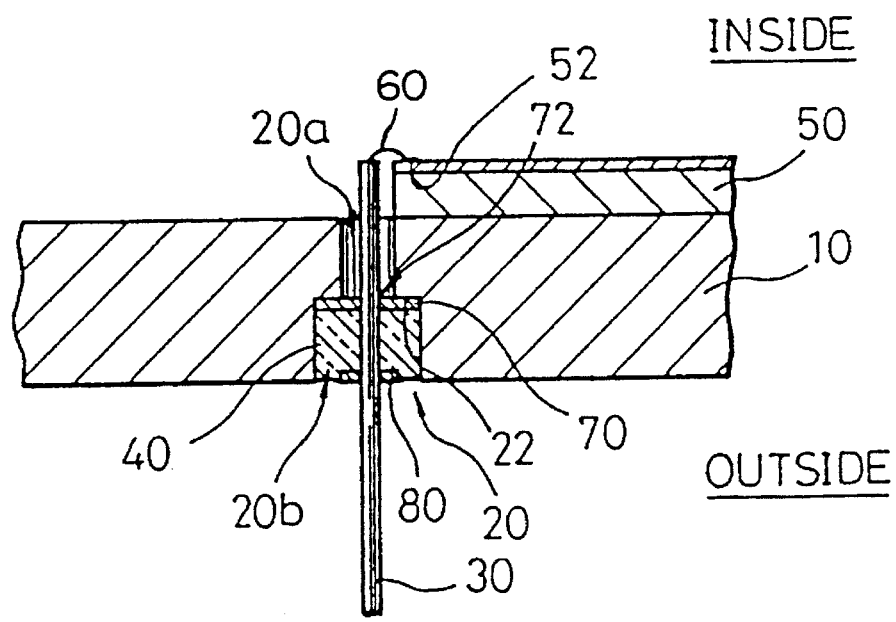
FIG. 4 is an enlarged cross-sectional view of a forth embodiment of this invention.
Figure 5:
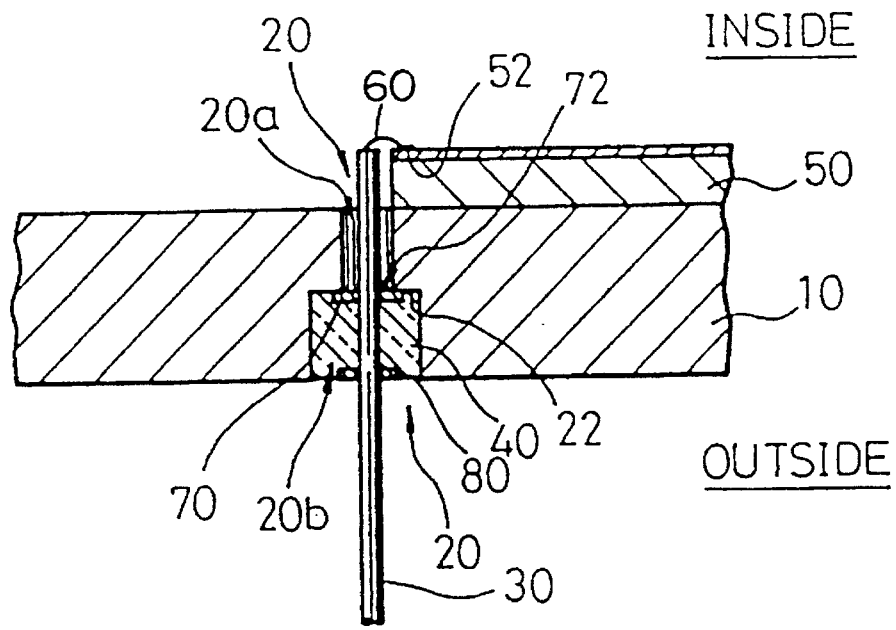
FIG. 5 is an enlarged cross-sectional view of a fifth embodiment of this invention.

FIGS. 4 and 5 show further preferred embodiments of a coaxial line assembly according to the present invention.

In the embodiment shown in FIG. 4, an outer diameter of the sealing plate 80 is reduced in comparison to the embodiment represented by FIGS. 4 and 5 shown in FIG. 3 to be near to the outer diameter of the lead 30. In addition, in the embodiment shown in FIG. 5, an outer diameter of the sealing plate 70 is also reduced to be near to the diameter of the opening of the inner hole portion 20a. In these embodiment, the cavity defined by the outer hole portion 20b defined by the side wall and the outer circumferential periphery of sealing plate 80 and the opposite sealing plate 70 is filled with the glass 40, without any gaps.

The remaining construction of the embodiments shown in FIGS. 4 and 5 are the same as those of the coaxial line assembly of the previous embodiments. Also, the operation thereof is the same as the previous embodiments, except for the following. Therefore, the same or corresponding parts in FIGS. 4 and 5 are indicated by the same reference numerals as those in the previous embodiments.

According to the respective embodiments shown in FIGS. 4 and 5, even if the sealing plate 70 or 80 has a dielectric constant which is different from that of the glass 40, the characteristic impedance of a portion of the lead 30, to which the sealing plate 70 or 80 is fitted, is prevented from becoming greatly out of order, since a part of the sealing plate 70 or 80 as shown in FIG. 3 or FIG. 4, respectively, was replaced by the glass 40.

Figure 6:
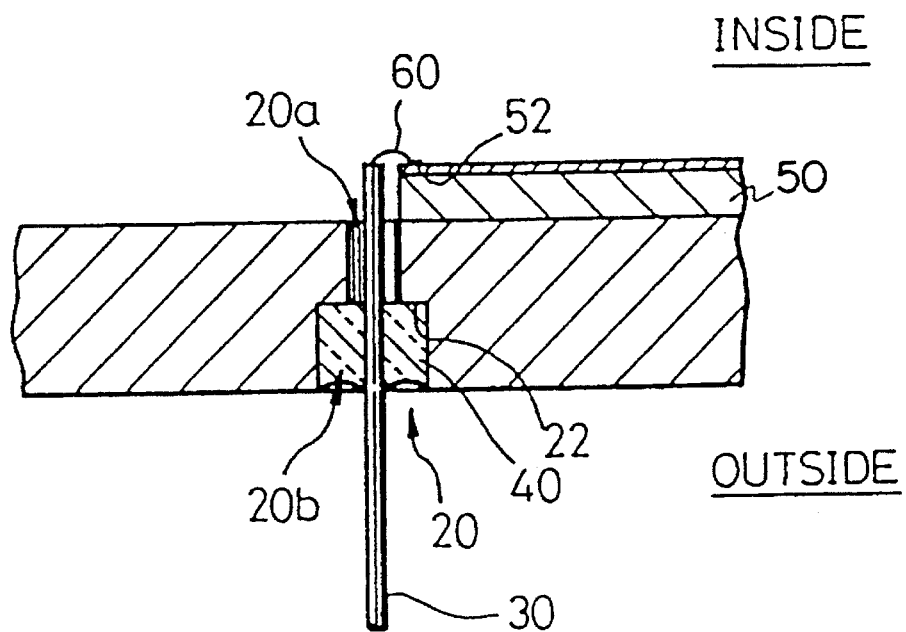
FIG. 6 is an enlarged cross-sectional view of a more fundamental embodiment of a coaxial line assembly known in the prior art.

FIG. 6 shows a more fundamental embodiment of a coaxial line assembly according to the present invention to improve the prior art as described above. In the embodiment shown in FIG. 6, the metal wall 10 which is provided with a through hole 20 having a circular cross-section. The through hole 20 is provided with a step 22 at an intermediate portion thereof in such a manner that a first hole portion 20a which has a relatively smaller diameter and is located at the inside of the metal wall 10 and a second hole portion 20b which has a relatively larger diameter and is located at the outside of the metal wall 10, in the same manner as the previous embodiment.

However, in this embodiment, there is no sealing plate, such as those indicated at 70 and 80 in the previous embodiments. Therefore, the lead 30 is hermetically sealed without any sealing plate by means of the glass 40 filled in the outer hole portion 20b. Glass 40 is made of, for example, borosilicate glass or a similar type glass.

A portion of the lead 30 is exposed in the inside gas environment (the relative dielectric constant being relatively low, such as, about 1.0) in the inner hole portion 20a which is communicated to the inside of the package and in which an inert gas is usually contained. Thus, a loss of transmission of high frequency signal due to a dielectric material can be reduced at minimum.

In the embodiment shown in FIG. 6, when hermetically sealing the lead 30 with the glass 40, to prevent the glass 40 from creeping up along a part of the lead 30 located in the inner hole portion 20a, it is advantageous that the oxidized films on a part of the lead located in the inner hole portion 20a and and on the inner wall of the inner hole portion 20a are removed to diminish the wet characteristic on these portions before the glass 40 is filled in the inner hole portion 20a.

In the same as the other embodiments, in FIG. 6, the reference numeral 50 indicates a substrate made of, for example, a dielectric material which is adhered onto the inner surface of the metal wall 10 via a metallized ground layer, such as a solder, so that a conductive line, pattern or pad 52 formed on the substrate 50 approaches in the vicinity of the lead 30. Thus, the conductive lens pattern or pad 52 can easily be connected to an inner top of the lead 30 by a short bonding ribbon or wire 60. This construction reduces a transmission loss of high frequency signal between the element in the package and the outside terminal (not shown).

Figure 7:
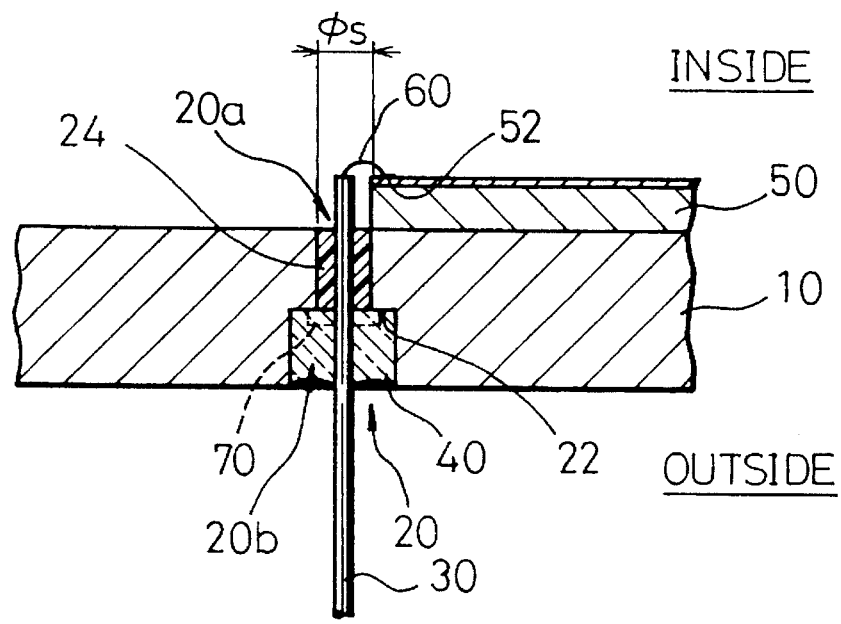
FIG. 7 is an enlarged cross-sectional view of a sixth embodiment of this invention.

FIG. 7 shows a modified embodiment of a coaxial line assembly shown in FIG. 6. In the embodiment shown in FIG. 7, the inner, i.e., smaller diameter, hole portion 20a of the through hole 20 is filled with a prescribed material 24 having a dielectric constant which is less than that of the glass 40 filled in the outer, i.e., larger diameter, hole portion 20b. The prescribed material 24 is preferably an expanded resin material, such as Gore Tex (Trademark), which contains many bubbles, so that the dielectric constant of the prescribed material 24 is about 2.0, substantially corresponding to the the dielectric constant of a gas, such as air, and less than that of the glass 40 which is about 4 to 9, although the dielectric constant of the glass 40 depends on the components thereof. The prescribed material 24 is preferably preformed as a ring or column-shaped body.

In the embodiment shown in FIG. 7, the inner diameter $\Phi_S$ of the opening of the inner hole portion 20a depends on the frequency and characteristic impedance of the signal transmitted by the leads 30 and the dielectric constant of the prescribed material 24. Of course, the inner diameter $\Phi_S$ in this embodiment is smaller than the inner diameter $\Phi_L$ of the through hole filled with a glass having no step portion 22 in the prior art as mentioned above. Therefore, in this embodiment, the substrate 50 having an electronic circuit can be located nearer to the lead 30 by $\Phi_L - \Phi_S/2$ as compared with the prior art. Therefore, the lead 30 can be connected to the electronic circuit or the conductive line, patter or pad 52 by a short bonding ribbon or wire 60 and thus any problems due to a miss-maching can be avoided.

In addition, the lead 30 can be held stably by the prescribed material 24. Therefore, an offset of the lead 30 caused by any external vibration exerted on the assembly when the assembly is fabricated or when the assembly is used as a semiconductor device can be prevented. Thus, the lead 30 is always located in a predetermined position, so that the characteristic impedance can be maintained constant.

The other construction shown in FIG. 7 is the same as that of the coaxial line assembly of the embodiment shown in FIG. 6. Also, the operation thereof is the same as the previous embodiments. Therefore, the same or corresponding parts in FIG. 7 are indicated by the same reference numerals as those in FIG. 6.

Figure 8:
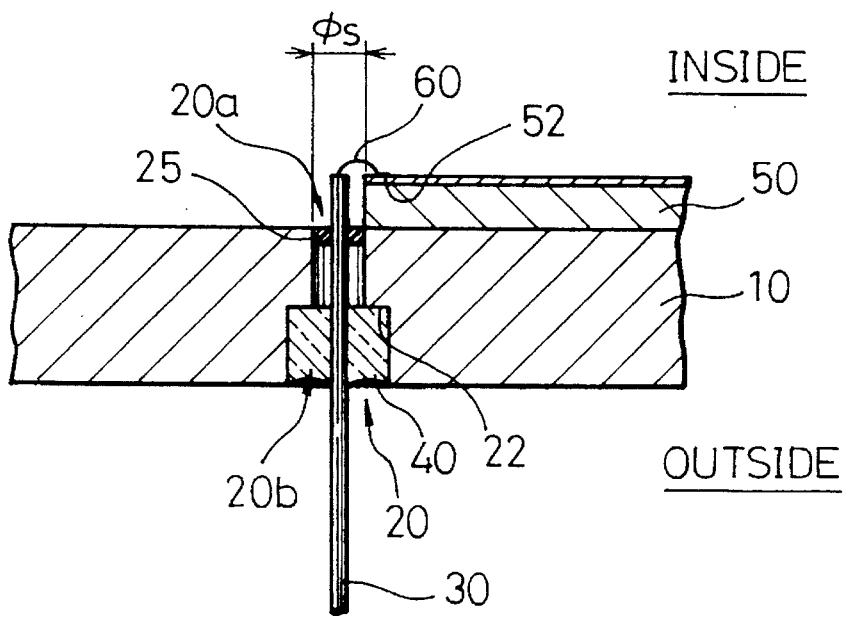
FIG. 8 is an enlarged cross-sectional view of a seventh embodiment of this invention.

In another modified embodiment shown in FIG. 8, only an opening of the inner, i.e., smaller diameter, hole portion 20a of the through hole 20 is closed by a thin plate 25. In still another embodiment shown in FIG. 9, the opening of the inner, i.e., smaller diameter, hole portion 20a of the through hole 20 is closed by a cap 26 having a flange.

Figure 9:
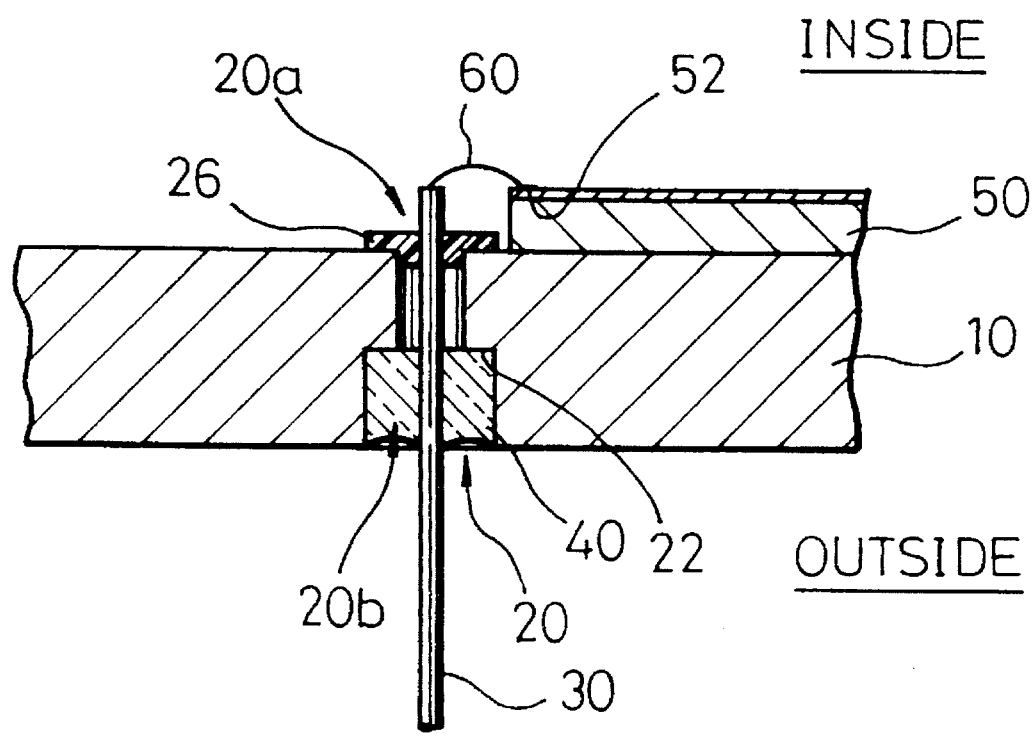
FIG. 9 is an enlarged cross-sectional view of a eighth embodiment of this invention.

In FIGS. 8 and 9, the thin plate 25 and the cap 26, respectively, can be made of a material same as the prescribed material 24 in the embodiment shown in FIG. 7, i.e., a material having dielectric constant is near to that of a gas, such as air.

In the embodiments shown in FIGS. 7, 8 and 9, it is advantageous that a sealing plate 70 and/or 80 is used in addition to the prescribed material 24, 25 or 26, as shown in FIG. 7, at 70. Although, in FIG. 7, only a sealing plate 70 as FIG. 2 is shown, in these embodiment, any kinds of sealing plate 70 and/or 80 as FIGS. 1–5 can be adopted.

Thus, in the embodiments shown in FIGS. 7, 8 and 9, the bonding ribbon or wire 60 can be shortened and the lead 30 can be held stably, so that the characteristic impedance can be maintained constant.

It should be understood by those skilled in the art that the foregoing description relates to only a preferred embodiment of the disclosed invention, and that various changes and modifications may be made to the invention without departing from the spirit and scope thereof.

We claim:

1. A coaxial line assembly in a package which houses a high frequency element, the package having an inside and an outside and the assembly comprising:

a metal wall having an inner surface at the inside of the package and an outer surface at the outside of the package, said metal wall having a hole which extends therethrough from the inner surface to the outer surface, said metal wall comprising a step, at substantially an intermediate portion of the hole, defining a smaller diameter, inner hole portion of said metal wall which opens to the inner surface and a larger diameter, outer hole portion of said metal wall which opens to the outer surface;

a lead which transmits a high frequency signal, the lead extending through the hole;

glass which is filled in the larger diameter, outer hole portion of said metal wall to hermetically seal said lead in the larger diameter, outer hole portion; and a material existing in the smaller diameter, inner hole portion of said metal wall, said material having a dielectric constant near to that of air, wherein said material is an expanded resin material which is filled in substantially the entire region defined by the smaller diameter, inner hole portion of said metal wall.

2. A coaxial line assembly as set forth in claim 1, wherein an opening exists at the step between the smaller diameter, inner hole portion of said metal wall and the larger diameter, outer hole portion of said metal wall, the coaxial line assembly further comprising a sealing plate which closes the opening existing at said step and is made of a dielectric material containing a glass component and having a dielectric constant near to that of said glass in the larger diameter, outer hole portion and a melting point higher than that of said glass in the larger diameter, outer hole portion, said lead extending through said sealing plate.

3. A coaxial line assembly in a package which houses a high frequency element, the package having an inside and an outside and the assembly comprising:

a metal wall having an inner surface at the inside of the package and an outer surface at the outside of the package, said metal wall having a hole which extends therethrough from the inner surface to the outer surface, said metal wall comprising a step, at substantially an intermediate portion of the hole, defining a smaller diameter, inner hole portion of said metal wall which opens to the inner surface and a larger diameter, outer hole portion of said metal wall which opens to the outer surface, and an inside opening exists where the smaller diameter, inner hole portion of said metal wall opens to the inside of the package;

a lead which transmits a high frequency signal, the lead extending through the hole;

glass which is filled in the larger diameter, outer hole portion of said metal wall to hermetically seal said lead in the larger diameter, outer hole portion; and a material existing in the smaller diameter, inner hole portion of said metal wall, said material covering the inside opening of said metal wall and partially filling the smaller diameter, inner hole portion of said metal wall, said material being an expanded resin material having a dielectric constant near to that of air.

4. A coaxial line assembly in a package which houses a high frequency element, the package having an inside and an outside and the assembly comprising:

a metal wall having an inner surface at the inside of the package and an outer surface at the outside of the package, said metal wall having a hole which extends therethrough from the inner surface to the outer surface, said metal wall comprising a step, at substantially an intermediate portion of the hole, defining a smaller diameter, inner hole portion of said metal wall which opens to the inner surface and a larger diameter, outer hole portion of said metal wall which opens to the outer surface, and an inside opening exists where the smaller diameter, inner hole portion of said metal wall opens to the inside of the package;

a lead which transmits a high frequency signal, the lead extending through the hole;

glass which is filled in the larger diameter, outer hole portion of said metal wall to hermetically seal said lead in the larger diameter, outer hole portion; and a cap having a flange and covering the inside opening of said metal wall, said cap being made of an expanded resin material having a dielectric constant near to that of air.

* * * * *

UNITED STATES PATENT AND TRADEMARK OFFICE
CERTIFICATE OF CORRECTION

PATENT NO. : 5,557,074

DATED : September 17, 1996

INVENTOR(S) : Miyamoto et al.

It is certified that error appears in the above-indentified patent and that said Letters Patent is hereby corrected as shown below:

Col. 3, line 51, delete "a".

Col. 5, line 15, delete "represented by Figs. 4 and 5";

line 20, after "ment," insert --represented by Figs. 4 and 5--; change "defined by" to --of--.

Col. 6, line 13, change "lens" to --line--;

line 43, change "patter" to --pattern--.

Signed and Sealed this

Fifteenth Day of July, 1997

Attest:

BRUCE LEHMAN

Attesting Officer

Commissioner of Patents and Trademarks